United States Patent [19]

Bergman et al.

[11] 4,257,010

[45] Mar. 17, 1981

[54] METHOD AND APPARATUS FOR SENSING AND MAINTAINING OSCILLATIONS IN AN OSCILLATING SYSTEM

[75] Inventors: Sven A. Bergman; Per J. Ohlsson; Karl-Gustav E. Nordqvist, all of Nynäshamn, Sweden

[73] Assignee: Rederiaktiebolaget Nordstjernan, Stockholm, Sweden

[21] Appl. No.: 760,800

[22] Filed: Jan. 19, 1977

[30] Foreign Application Priority Data

Jan. 28, 1976 [SE] Sweden .................................. 7600912

[51] Int. Cl.$^3$ ........................................... G05D 19/02
[52] U.S. Cl. ..................................... 331/65; 331/156; 331/165; 340/562; 340/665; 324/236
[58] Field of Search ................. 331/65, 111, 156, 165; 324/236, 237, 207; 328/1, 5; 340/657, 658, 584, 665, 561, 562, 541

[56] References Cited

U.S. PATENT DOCUMENTS 3,140,462  7/1964  Hayes ................................ 340/665 X Primary Examiner—Siegfried H. Grimm
Assistant Examiner—Edward P. Westin
Attorney, Agent, or Firm—Pollock, Vande Sande & Priddy

[57] ABSTRACT

A method and apparatus for delivering energy to an oscillatory system in a signal transmitter to maintain the system in a state of oscillation. A component of the oscillatory system that affects the oscillation frequency is influenced by the magnitude of a measured condition which is to be transmitted by the signal transmitter. The oscillatory state of the system is sensed through a signal path, and energy is delivered to the system through substantially the same signal path, said energy being delivered in the form of pulses at time intervals longer than a whole period of oscillation of the system to maintain the system in a state of oscillation.

11 Claims, 3 Drawing Figures

METHOD AND APPARATUS FOR SENSING AND MAINTAINING OSCILLATIONS IN AN OSCILLATING SYSTEM

Transmitters of various forms and constructions are used for converting a measured chemical or physical parameter of condition to a signal more adapted for transmitting and additional processing than the magnitude of the measured condition. In general, this conversion takes place such that the magnitude of the measured condition is, by appropriate means, converted into another physical or chemical magnitude which either is the desired signal or in known manner can in a simple way be converted into desired signal form. In some cases the magnitude of the measured condition can be directly converted into the desired signal form, for instance a change of length can be converted directly by means of a potentiometer to a resistance change, while in many cases the conversion into the final form takes place via measurement of a secondary condition. For example, a force or a liquid pressure is converted into a change of length by allowing the magnitude of a measured condition to influence an elastic body, the elongation of which is measured with appropriate means, for instance strain gauges.

Up to now, the components most adapted for signal processing and presentation from both technical and economic points of view and equipments built thereof have been of analogue nature, which is the cause that most transmitters have been constructed for emitting an analogue signal, i.e. the information from the transmitter has been emitted in the form of a level change of the output signal from the transmitter, for instance a direct current change, a change of alternating current amplitude or a change of pressure, for instance air pressure.

The development in recent years within the field of digital signal-processing technics and with the accompanying possible increase of accuracy and stability, has caused that a means for converting from analogue to digital form has had to be inserted in the signal transmission chain from the transmitter to the signal processing equipment.

Another type of transmitters, which are better adapted for a more direct connection to digital signal processing systems, are those emitting their information in the form of a frequency change instead of an amplitude change of the output signal. A signal transmission by frequency-modulation, contrary to the amplitude-modulating of the analogue transmitters, has besides the extremely simplified method when connected to the digital signal processing equipment also advantages as to less interference sensitivity and lower demands upon the signal lines.

The transmitters emitting information as a frequency modulated signal are of course built up such that the magnitude of a measured condition, possibly after conversion in an appropriate conversion element, can effect the parameters in an electrical, acoustical or mechanical oscillating system (oscillating circuit), so that the inherent oscillation frequency of the oscillating system receives a change which is a function of the change in magnitude of the condition being measured. Thus, for instance, the inherent oscillation frequency in an electrical oscillating system can be influenced by allowing the magnitude of a condition being measured to affect either an inductance or capacitance or both simultaneously. In a mechanical oscillating system the mass or its return force, i.e. the spring constant, can in a corresponding manner be influenced by the magnitude of a measured condition and thereby give rise to a frequency change which can be measured with known methods.

Owing to the fact that the oscillating systems capable of being used in practice always have losses, in the form of electrical resistance losses or mechanical friction losses, energy must be delivered to the oscillating system in order to be able to maintain the oscillation during a longer period of time. This additional energy is obtained in such a manner, that oscillation is measured, is amplified, and is then returned to the oscillating system in such a phase that the oscillation receives an energy addition. An example of this technic known since long ago is the various oscillator couplings which are found within the field of radio technics. A corresponding method is utilized when using mechanical oscillating systems, for instance tuning fork oscillators or transmitters based on a change in the frequency of an oscillating string. In these constructions the mechanical oscillating system is excited with appropriate means, for instance an electromagnet, and the motion or velocity of the oscillating system is measured by another element adapted to do this, for instance a permanent magnet coil. Owing to the mechanical oscillation a voltage is generated in the permanent magnet coil, which voltage after amplification is conducted to the excitation coil, thereby maintaining the voltage continuously. Even if these methods for maintaining a continuous oscillation have been proved to have satisfactory operation for many applications, they have several disadvantages, particularly for use in transmitters.

The known methods, described above, for maintaining a continuous oscillation in an oscillating system requires, that, besides the oscillating system itself, another sensing element is included in order to be able to measure the oscillation state of the oscillating system, so that energy can be fed back to the oscillating system and thereby compensate for the circuit losses. The insertion of such a sensing element complicates the construction and is also accompanied by a rise in the cose of the construction. Moreover, the construction can not be formed in most appropriate way considering accuracy and stability.

Furthermore, the known methods also require that two signal paths exist, one for the delivery of necessary energy addition to the oscillating system and the other for sensing the oscillation state of the oscillating system. This means a technical complication as well as an economic loading for the construction. The technical complication is related to the fact that both signal paths must be well separated so that an energy transmission can not occur. Should the paths not be well separated, an oscillation can arise, the frequency of which is not a function of the parameters of the oscillating system. From an economic point of view the required doubling of the signal paths means that the number of wire (line) parts in an electrical system increases and also that the parts must be separated from each other in best possible way. Said disadvantages are of course particularly valid for transmitters which operate in difficult surroundings and hence require special configuration of the signal lines.

The above mentioned disadvantages involved in the technics known up to now have proved to have such a great practical importance, that they have overshadowed the above mentioned advantages of having frequency-modulated signals and thereby prevented a development to be desired per se of transmitters having a frequency-modulated output signal.

By a method and an apparatus according to the invention, the above mentioned disadvantages in the technics known up to now are obviated.

In respect to this, the present invention relates to a method for sensing the oscillation state of an oscillating system in a transmitter and for delivering energy to the oscillating system for maintaining the oscillation in the oscillating system, wherein at least one frequency-determinative parameter in the oscillating system is affected by the magnitude of a measured condition, and the method according to the invention is in its broadest aspect characterized in that the sensing of the oscillation state of the oscillating system takes place by means of the same signal path as the delivery of the energy for the maintenance of the oscillation in the oscillating system.

In a method according to the invention the energy is preferably delivered to the oscillating system during a time period which is shorter than the time passing between the end of one energy delivery and the beginning of the next. Moreover, the energy is preferably delivered during a time period which is not longer than a whole period of the oscillation in the oscillating system. In an often preferred method according to the invention the energy is delivered in pulses, the duration of which is essentially shorter than a half period of the oscillation in the oscillating system.

As mentioned above, the present invention also relates to an apparatus for carrying out the method.

A method and an apparatus according to the invention can be used for mechanical, electrical or acoustical oscillating systems or for combinations of these systems. It has been proved, that mechanical oscillating systems in transmitters having a frequency-modulated output signal can offer certain advantages over for instance electrical oscillating systems. In the following description with reference to the accompanying drawings, however, not only methods and apparatus using mechanical oscillating systems are described but also methods and apparatus using electrical oscillating systems.

Generally, the method according to the present invention contemplates that sensing of the oscillation state in an oscillating system of a transmitter takes place by means of the same signal path as is employed for the delivery of energy to the oscillating system to maintain oscillation of the oscillating system.

Figure 1:
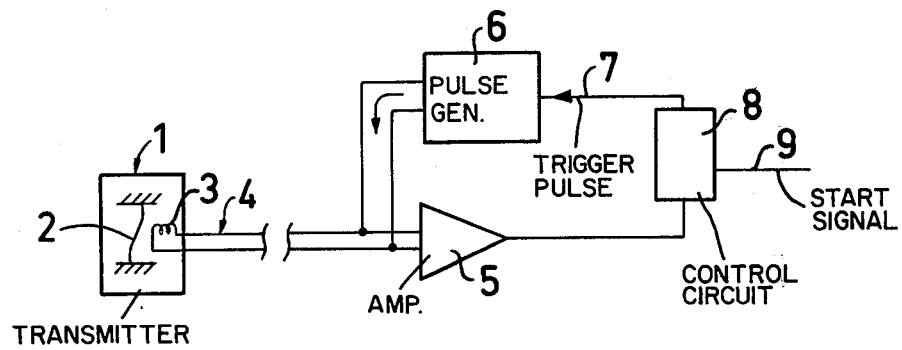
FIG. 1 is a schematic view of an embodiment of an apparatus according to the invention, by means of which the method according to the invention can be carried out with the use of a mechanically oscillating system.

In the apparatus shown in FIG. 1 for carrying out such a method, a transmitter 1 includes a mechanical oscillating system which in this case is represented by a taut oscillating band 2. The band, which is depicted in the drawing as a curved element mounted between two points of mounting, can for instance be an oscillating band as disclosed in Swedish Patent No. 332 902 (corresponding to U.S. Pat. No. 3,626,754). The transmitter 1 further includes means for sensing the state of the oscillating system and for feeding energy into the oscillating system, in this case a coil 3. The coil 3 is positioned near to the band 2 and is formed such that a current pulse through the coil affects the band 2 with a force pulse simultaneously as a motion in the band generates a voltage over the coil. The transmitter 1 is furthermore constructed such that the magnitude of the condition being measured influences the mechanical oscillating system, i.e. the band 2, so that its inherent oscillation frequency is changed as a result of a change of magnitude of a measured condition. The transmitter can be directly connected to a measuring object or can be connected via a converting element (secondary measuring object), for instance as disclosed in Swedish Pat. No. 398,268. The energy delivery to the band 2 as well as the sensing of the motion of the band can of course take place with means other than the coil 3, for instance piezo-electric, pneumatic or acoustic means.

The transmitter 1 is connected via a signal line 4 to a device constructed for sensing the oscillation state of the oscillating system 2 and for delivering an energy pulse to the oscillating system at appropriate points of time. In the embodiment shown in FIG. 1, the line 4 is a two-wire cable which in the transmitter 1 is connected to the coil 3 and at the other end is connected to a device for sensing the oscillation state, here represented by the amplifier 5, as well as to a pulse generator 6 which is constructed such that upon signal on its control input (trigger input) 7, it provides a current pulse through the coil 3. The control input 7 of the pulse generator is connected to the output of the device 5 via a control circuit 8.

The mode of operation of the coupling shown in FIG. 1 is as follows: assume that at the beginning the oscillating system, i.e. in this embodiment the band 2, is in a state or repose. A start signal is delivered to the control circuit 8 via a start signal line (wire) 9. The control circuit 8 generates a signal on the control input 7 of the pulse generator 6, so that the pulse generator delivers an energy pulse to the oscillating system, i.e. in this case a current pulse through the coil 3. The input of the part of the equipment sensing the oscillation state, i.e. in this case the amplifier 5, can, should it be necessary, be protected by instantaneously disconnecting the input from the signal line from the transmitter or by taking other protection steps, for instance switches or diodes. As a result of the energy pulse from the pulse generator 6, the oscillating system 2 will be imparted a more or less damped oscillation state. The frequency of this oscillation will be dependent on the configuration of the oscillating system and on the magnitude of the condition being measured which affects the frequency-determining parameter or parameters. The oscillation state of the oscillating system 2, and thus its frequency, is sensed as a voltage over the connections of the coil 3 by means adapted for this (in this embodiment the amplifier 5) to the output of which frequency determination (classification) means can in conventional manner be connected (not shown).

The chief object of the control circuit 8 is to deliver a control signal to the pulse generator 6, so that a new energy pulse can be delivered to the oscillating system at such point of time, that this energy delivery does not to any essential extent influence the oscillating state of the oscillating system in any respect other than to increase the amplitude of the oscillation. Thus, the control circuit 8 can include means for, for instance, determination of the zero intersection of the oscillation, means for the determination of the point of time when the amplitude of the damped oscillation becomes lower than a determined limit value, and/or means for determining the time that has passed from a preceding energy pulse or the number of oscillations the oscillating system has made since a preceding energy pulse delivery, as well as means for controlling the energy content of the energy pulse delivered from the pulse generator 6. The control circuit 8 can furthermore include means for phase distortion of the incoming signals in order to ensure that the energy pulse is delivered at the right moment. Such phase distortion means can of course also be embodied in the amplifier 5, which also can include filters for filtering out interference signals which are outside of the range of frequencies within which the oscillating frequency of the oscillating system may vary as a result of variations of the primary measuring magnitude.

In the example stated above it has been assumed that the magnitude of a measured condition affects the frequency-determining parameter or parameters of the oscillating system, and that consequently the transmitter information is transmitted as a frequency change. The method according to the invention can of course also be used in cases when the magnitude of a measured condition influences the damping conditions of the oscillating system. In these cases there is arranged means in the equipment, for instance in the control circuit 8, for determining the damping of the oscillation in a manner known per se, for instance by determining the number of oscillations which the oscillating system must perform in order to achieve a predetermined percentage decrease of the amplitude.

Figure 2:
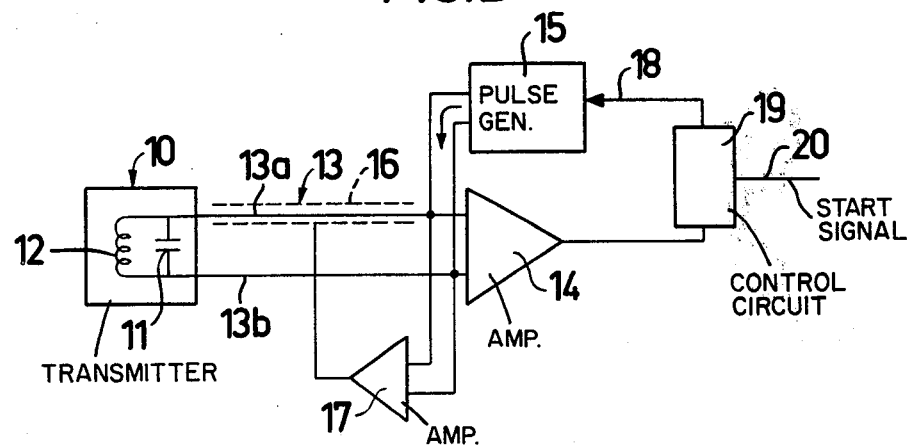
FIG. 2 is a schematic view of an embodiment of the invention using an electrical oscillating system.

A method and an apparatus according to the invention is not limited to use with mechanical oscillating systems, but can advantageously be used also in cases when the transmitter has an electrical oscillating system (oscillating circuit), the frequency or damping-determining parameter or parameters of which are affected by the magnitude of a condition being measured. FIG. 2 shows a transmitter 10 which includes an electrical, parallel oscillating system (parallel oscillation circuit) consisting of a capacitance 11 and an inductance 12 which via a signal path 13 consisting of a wire pair 13a and 13b is connected to an input amplifier 14 and a pulse generator 15 in the same manner as stated above in the description of FIG. 1. The wires 13a and 13b are for practical reasons positioned near to each other, which when using long wire lengths can cause problems owing to the fact that the capacitance between the wires will generate a capacitance parallel with the capacitance 11 resulting in a change of the self-oscillation frequency of the oscillating system. This interfering influence can be decreased by surrounding one of the wires, for instance the wires 13a as shown, with a separate shield 16. This shield is given the same potential relative to the wires 13b, as the wires 13a has, by connecting the shield to the output of an amplifier 17, the input of which is connected to the wires 13a and 13b. The amplifier 14 can of course be utilized for the same purpose. The apparatus shown in FIG. 2 includes, in conformity with the apparatus shown in FIG. 1, a control input (here designated 18), a control circuit (here designated 19) and a start signal line (here designated 20). The mode of operation is the same as described above for the apparatus according to FIG. 1.

Figure 3:
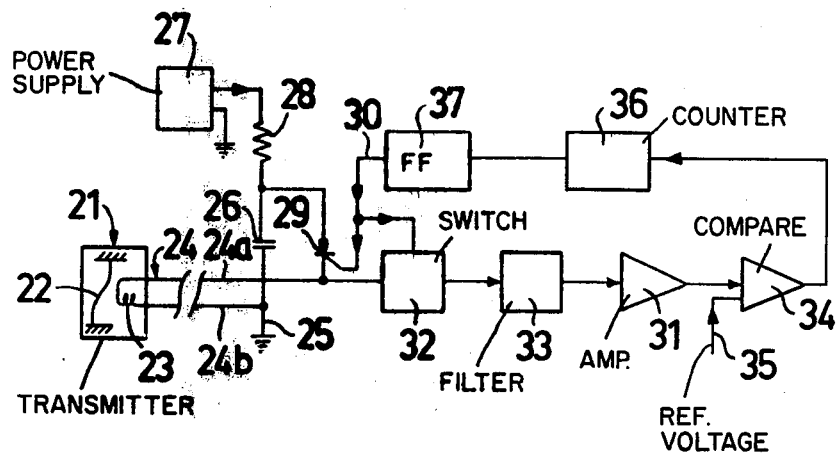
FIG. 3 is a schematic view of a further embodiment of the invention using a mechanical oscillating system.

Another embodiment of an apparatus for carrying out the method according to the invention is shown in FIG. 3. The transmitter 21 in this embodiment is shown to have a mechanical oscillating system 22 similar to the embodiment shown in FIG. 1. However, the apparatus can of course have an electrical oscillating system, for instance a system as described above with reference to FIG. 2. A coil 23 is used to deliver energy to the oscillating system 22 and for sensing its oscillating motion. The coil 23 is connected to a device for sensing the oscillations and for delivering the energy pulses via a signal path 24 consisting of a wire pair 24a and 24b. One of the wires 24b, is connected to a ground point 25 common to the apparatus. A pulse generator consisting of a condenser 26 and a thyristor, or a semi-conductor coupling 29 equivalent in operation, are used for generating energy pulses. The condenser is charged to a voltage, which is adjustable manually or electrically, by a power supply 27 over a resistance 28. The thyristor or the semi-conductor coupling 29 can be brought into conducting state by a control pulse in a control line (wire) 30, so that the condenser 26 is discharged through the coil 23 in the transmitter 21 and thereby delivers energy to the oscillating system 22. The coil 23 in the transmitter 21 is also connected to an amplifier 31, possibly as shown in FIG. 3 via an electrically governed reversing switch 32 and a filter 33. The object of the switch 32 is to protect the amplifier input from the high-energy pulse which is generated upon the discharge of the condensor 26 through the thyristor 29. The object of the filter 33 is to decrease interference from a frequency lying outside of the frequency range, within which the inherent frequency of the oscillating system may vary. A signal representing the damped inherent frequency of the oscillating system will be found at the output of the amplifier 31 between the points of time for the energy pulse delivery. This signal is conducted to one input of a comparing unit 34, the reference voltage of which by line 35 either is set manually or with means known per se is controlled by the signal amplifier 31. The output signal of the comparing unit 34, which signal is a frequency corresponding to the frequency at which the oscillating system oscillates but having constant amplitude, is conducted to a counter 36. This counter is constructed such that, after it has counted a predetermined number of pulses, it emits a pulse to a circuit 37 (monostable flip-flop) arranged for delivering a control pulse, determined in time extension and amplitude, to the thryistor 29 and to the switch 32, and thereby an energy pulse is delivered to the oscillating system in accordance with what has been described above. Immediately after the energy pulse has been delivered, the amplifier 31 is again switched in via switch 32 and filter 33 at the same time as the counter 36 is reset, and the cycle is repeated. The frequency determined by the oscillating system 22 is taken out from the output of the amplifier 31 or the comparing unit 34. The lower frequency delivered from the output of the counter 36 can also be used as an output signal. Means required for starting the apparatus (for instance a start signal line 9 as shown in FIG. 1) as well as conventional means required for resetting the counter and governing the progress are not shown in FIG. 3.

Naturally, the above described method with reference to FIG. 3 can be combined with the method described in connection to FIG. 2 for decreasing the influence of cable capacitance.

The energy pulse delivered to the oscillating system for maintaining its oscillation can be given various form and time extension. A pulse can be used which is of the same form as a multiple of a whole or a half period of the frequency of the oscillating system in order to avoid to the utmost possible extent a non-desired interference of the state of the oscillating system in other respects than the intended amplitude increase. However, it is desirable from measuring technic points of view to form the transmitter and its oscillating systems such that a frequency change as large as possible is achievable. In such a case it can be appropriate to use an apparatus operative to produce a pulse form equal to a multiple of a whole or a half oscillating period. In these cases it has proved to be advantageous to use a pulse which is short in comparison with the oscillating period delivered to the oscillating system at appropriate points in its oscillating motion.

Within the frame of the present invention, although not shown, it is possible to use the same device for sensing the state and for delivering energy for a plurality of transmitters by providing a switch between the transmitters and said device in a manner known per se. Moreover, the signal paths in the embodiments described above and shown in the drawings consists of electric wires. However, within the frame of the present invention the signal paths can consist of other transmission means than electric wires, as for instance microwave transmission, acoustic transmission, and optical transmission.

We claim:

1. A method for delivering energy to an oscillatory system in a signal transmitter to maintain said system in a state of oscillation, a component of the oscillatory system that affects the oscillation frequency of the system being influenced by the magnitude of a measured condition which magnitude is to be transmitted by the signal transmitter, said method comprising sensing the oscillatory state of the system through a signal path, and delivering energy to said system through substantially the same signal path, said energy being delivered in the form of pulses at time intervals longer than a whole period of oscillation of said system to maintain said system in a state of oscillation.

2. A method as claimed in claim 1 wherein said energy pulses are delivered to the oscillatory system during time periods which are shorter than the time elapsing between the end of one energy delivery period and the beginning of the next.

3. A method as claimed in claim 1 wherein said energy pulses are delivered during time periods which are not longer than a whole period of the oscillation in the oscillatory system.

4. A method as claimed in claim 1 wherein the duration of each said energy pulse is shorter than a half period of the oscillation in the oscillatory system.

5. A signal transmitter comprising an oscillatory system, means for affecting the oscillation frequency of said system in response to influence by the magnitude of a measured condition which magnitude is to be transmitted, means for sensing the oscillatory state of the system, and means for delivering energy to said system, said sensing means and said energy delivery means each being connected to said oscillatory system by means of substantially the same signal path, said energy delivery means comprising a pulse generator controlled by a control means to deliver said energy in the form of pulses at time intervals longer than a whole period of oscillation in said system to maintain said system in a state of oscillation.

6. A signal transmitter as claimed in claim 5 wherein said pulse generator comprises a capacitor, a voltage unit, a resistance, and a thyristor.

7. A signal transmitter as claimed in claim 5 wherein said pulse generator comprises an oscillator adapted to deliver the energy in pulses.

8. A signal transmitter as claimed in claim 5 wherein the oscillatory system comprises a mechanical oscillatory system.

9. A signal transmitter as claimed in claim 8 wherein said mechanical oscillatory system comprises a taut band.

10. A signal transmitter as claimed in claim 9 wherein said taut band is curved between fixed end portions thereof.

11. A signal transmitter as claimed in claim 5 wherein the oscillatory system comprises an electrical oscillatory system.

* * * * *